(12) United States Patent
Miyanari (10) Patent No.: US 7,211,168 B2
(45) Date of Patent: May 1, 2007

(54) SUBSTRATE SUPPORTING PLATE AND STRIPPING METHOD FOR SUPPORTING PLATE

(75) Inventor: Atsushi Miyanari, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 54 days.

(21) Appl. No.: 11/001,574

(22) Filed: Dec. 1, 2004

(65) Prior Publication Data

US 2005/0173064 A1 Aug. 11, 2005

(30) Foreign Application Priority Data

| Dec. 1, 2003 | (JP) | ............................. 2003-402206 |
| Oct. 6, 2004 | (JP) | ............................. 2004-293158 |
| Nov. 29, 2004 | (JP) | ............................. 2004-343547 |

(51) Int. Cl.
*B32B 38/10* (2006.01)
(52) U.S. Cl. ...................... 156/344; 156/584
(58) Field of Classification Search ................ 156/344, 156/584
See application file for complete search history.

(56) References Cited

U.S. PATENT DOCUMENTS

| 3,762,038 A * | 10/1973 | Ruggiero ...................... 438/21 |
| 3,988,196 A * | 10/1976 | Wanesky ...................... 156/541 |
| 4,247,590 A * | 1/1981 | Hayakawa et al. .......... 428/210 |
| 4,466,852 A * | 8/1984 | Beltz et al. ................... 156/344 |
| 4,530,776 A * | 7/1985 | Hisamoto et al. ............ 510/412 |
| 4,866,501 A * | 9/1989 | Shanefield ................... 257/684 |
| 5,273,615 A * | 12/1993 | Asetta et al. ................. 156/584 |
| 5,493,175 A * | 2/1996 | Kani ........................... 313/584 |
| 5,800,665 A * | 9/1998 | Okaniwa et al. ............. 156/344 |
| 6,076,585 A * | 6/2000 | Klingbeil et al. ............ 156/584 |
| 6,270,002 B1 * | 8/2001 | Hayashi et al. .............. 228/246 |
| 6,491,083 B2 * | 12/2002 | De et al. ...................... 156/584 |
| 6,492,195 B2 * | 12/2002 | Nakanishi et al. ........... 438/106 |
| 7,052,934 B2 * | 5/2006 | Kurimoto et al. ............ 438/106 |
| 2004/0235269 A1 * | 11/2004 | Kitamura et al. ............ 438/460 |

FOREIGN PATENT DOCUMENTS

| JP | 06-302282 | 10/1994 |
| JP | 2001-077304 | 3/2001 |
| JP | 2002-203821 | 7/2002 |
| JP | 2002-270676 | 9/2002 |

* cited by examiner

*Primary Examiner*—Mark A. Osele
(74) *Attorney, Agent, or Firm*—Carrier, Blackman & Associates, P.C.; Joseph P. Carrier; William D. Blackman (57) ABSTRACT

There is provided a supporting plate having a structure in which a solvent can be supplied to an adhesive layer between the supporting plate and a substrate such as a semiconductor wafer in a short period of time after the substrate is thinned, and also a method for stripping the supporting plate.

The supporting plate may have a larger diameter than the semiconductor wafer, and penetrating holes are formed in the supporting plate. The outer peripheral portion of the supporting plate is a flat portion in which no penetrating hole is formed. When alcohol is poured from above the supporting plate, the alcohol reaches the adhesive layer through the penetrating holes, dissolves and removes the adhesive layer.

7 Claims, 5 Drawing Sheets

SUBSTRATE SUPPORTING PLATE AND STRIPPING METHOD FOR SUPPORTING PLATE

BACKGROUND OF THE INVENTION

1. Field of the Invention

The present invention relates to a supporting plate which is attached to a substrate such as a semiconductor wafer to support the substrate when the substrate is thinned, and also relates to a method for stripping the supporting plate.

2. Description of the Prior Art

There has been a need of making IC cards for cell phones thinner, smaller, and lighter. In order to satisfy this need, a semiconductor chip to be incorporated therein must be thin. Although the thickness of a wafer which forms a semiconductor chip is 125–150 μm at present, it is expected that the thickness of a semiconductor wafer must be 25–50 μm for a next generation chip.

Figure 7:
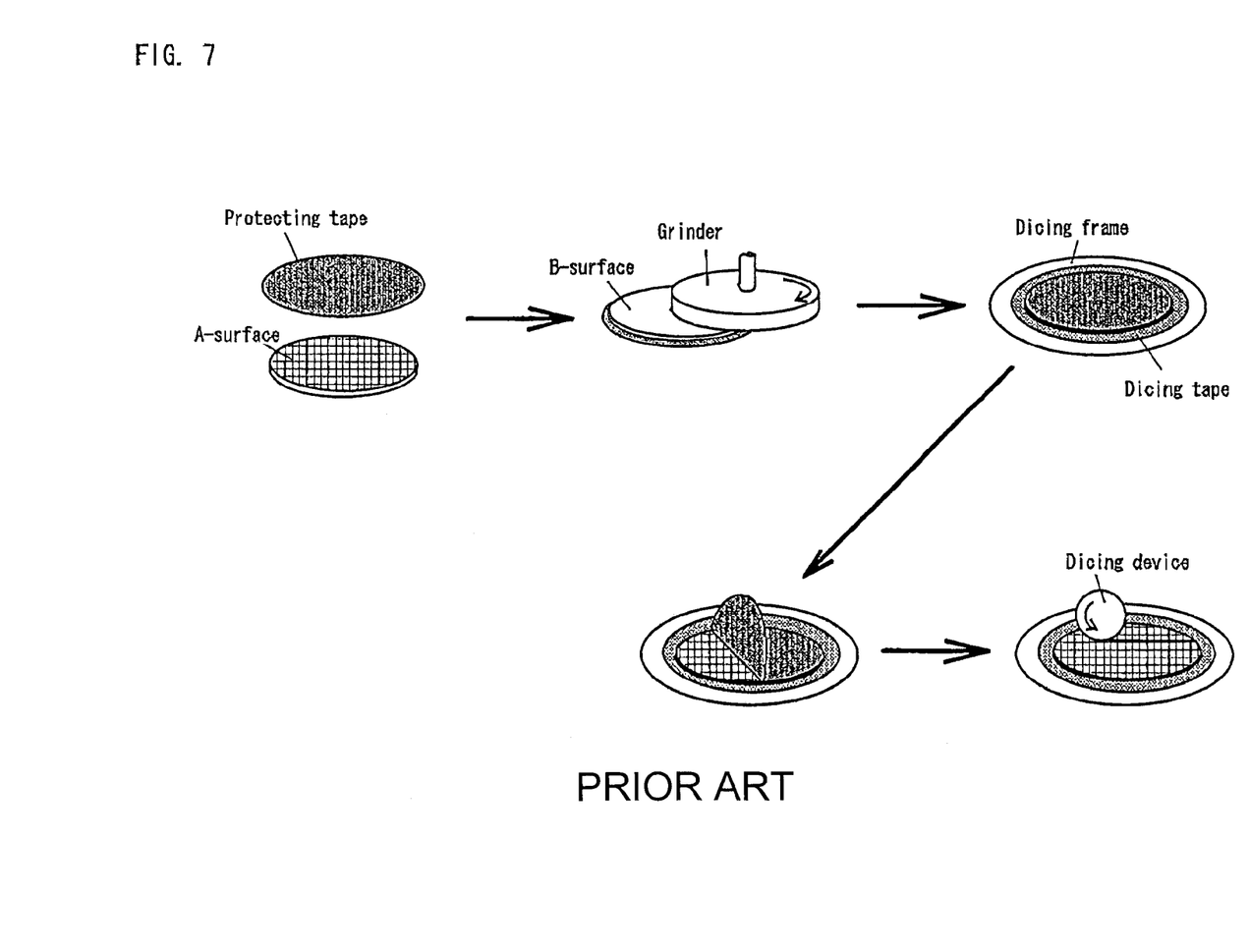
FIG. 7 is a view showing processes for thinning a semiconductor wafer according to a conventional method.

A conventional method for thinning a semiconductor wafer is shown in FIG. 7. Specifically, a protecting tape is attached to a surface (A-surface) of a semiconductor wafer on which a circuit (element) has been formed. The wafer is turned over, and the rear surface (B-surface) of the semiconductor wafer is ground by a grinder so as to make the wafer thin. The rear surface of the semiconductor wafer which has been thinned is fixed onto a dicing tape retained by a dicing frame, and the protecting tape covering the surface (A-surface) of the semiconductor wafer on which a circuit (element) has been formed is stripped in this state. Next, the wafer is cut into each chip by a dicing device.

The above-mentioned method has been disclosed in Document 1. According to Document 1, the protecting tape having heat resistance is stripped from the semiconductor wafer by using a strong adhesive tape which is bonded to one end of the protecting tape.

Document 2 has disclosed that a protecting base is obtained by immersing ladder-type silicone oligomer in an aluminum nitride—boron nitride porous sintered material is used instead of a protecting tape, and the protecting base and a semiconductor wafer are bonded by using a thermoplastic film. Document 2 also mentions that they are immersed in pure water at 80° C. for 3 hours before stripping.

Document 3 has disclosed that a protecting base is made of a material having the same thermal expansion coefficient as a semiconductor wafer such as alumina, aluminum nitride, boron nitride, or silicon carbide. Also, Document 3 has proposed a method in which the protecting base and the semiconductor wafer are bonded by using a thermoplastic resin such as polyimide, the semiconductor wafer is thinned by a grinder, and thereafter stripping is performed by immersing in water, amine, or a mixed solution of water and amine, or by using steam.

Although the technical field is different, Document 4 has disclosed that Invar (alloy of 36% Ni and Fe) is used for part of a shadow mask (at the side irradiated with electron beams) for a Braun tube.

[Document 1] Japanese Patent Application Publication No. 2002-270676, paragraph 0035

[Document 2] Japanese Patent Application Publication No. 2002-203821, paragraph 0020

[Document 3] Japanese Patent Application Publication No. 2001-77304, paragraphs 0010, 0017 and 0020

[Document 4] Japanese Patent No. 3440333, paragraph 0007

In the case of using the protecting tape as disclosed in Document 1, cracking or chipping of the semiconductor wafer easily occurs when the tape is stripped. Also, the protecting tape is not sufficient to support the thinned semiconductor wafer. Consequently, transfer needs to be conducted by manpower, and automation is impossible.

In the techniques of Documents 2 and 3, handling or transfer can be automated by using alumina, aluminum nitride, boron nitride, or silicon carbide as a supporting plate instead of a protecting tape. However, since it is difficult for a solvent to enter between the supporting plate and the semiconductor wafer at the time of stripping, it takes too much time to strip the supporting plate from the semiconductor wafer.

Also, the thermoplastic film bonding the support plate and the semiconductor wafer often fails to completely dissolve, and tends to be left in a state of sticking to either one of the support plate and the semiconductor wafer.

Another method has been known in which a glass substrate is used as a supporting plate, the glass substrate and a semiconductor wafer are bonded by using an ultraviolet curable wax or a double-faced adhesive tape, and the glass substrate and the semiconductor wafer are stripped from each other by being irradiated with ultraviolet rays having a different wavelength from the ultraviolet rays used for curing. However, if the circuit-formed surface of the semiconductor wafer is irradiated with the ultraviolet rays, the element (CCD or CMOS) might be damaged.

In the case of using alumina, aluminum nitride, boron nitride, or silicon carbide as the protecting base, since a magnet cannot be employed at the time of stripping, the apparatus must be complicated.

SUMMARY OF THE INVENTION

In order to solve the above-mentioned problems, according to the present invention, there is provided a supporting plate having a diameter identical to or larger than the diameter of a substrate to which the supporting plate is attached, wherein a plurality of penetrating holes are provided in the thickness direction of the supporting plate so as to allow a solvent to pass therethrough.

In the case where the diameter of the supporting plate is larger than that of the substrate, the outer peripheral portion of the supporting plate, which is outside from the area covered by the edge portion of the substrate, may be a flat portion in which no penetrating hole is formed.

As for the material of the supporting plate, it is preferable to select a material whose thermal expansion coefficient is close to that of the substrate as much as possible ($5.0 \times 10^{-6}$ or less) so as to prevent warpage from occurring by heat applied (for metalizing after grinding) in a state where the substrate and the supporting plate are attached to each other. Specifically, a low thermal expansion material having a thermal expansion coefficient of $1.5 \times 10^{-6}$ or less is preferable, and the examples include an alloy of Ni and Fe, ceramic, and glass.

As a method for stripping the supporting plate from the substrate after the substrate is thinned by grinding, a solvent for dissolving an adhesive bonding the supporting plate and the substrate is supplied from outside the supporting plate, the solvent is allowed to reach the adhesive through the penetrating holes of the supporting plate so as to dissolve the adhesive, and thereafter the supporting plate is stripped from the substrate. It is preferable to transfer the thinned substrate to which the supporting plate has been attached to a dicing tape before the solvent is supplied.

As a jig for supplying the solvent, a jig comprising a solvent supplying plate and an O-ring can be used. In operation, the solvent supplying plate is laid onto the supporting plate via the O-ring, and the solvent is supplied through the solvent supplying plate to the space sealed by the supporting plate, the O-ring, and the solvent supplying plate. Also, as another means, a sprayer, an ultrasonic nozzle, or a two-fluid nozzle (gas-liquid mixed nozzle) can be used, or it is also possible to immerse in a tank filled with a solvent.

As a method for stripping the supporting plate from the substrate, it is possible to attract part of the periphery of the support plate by using a magnet. However, if the supporting plate is made of glass, it is impossible to attract by a magnet. Therefore, the stripping is performed mechanically by hooking the end surface of the glass with a jig.

As the solvent, alcohol, alkali, ketone, a mixed solution of alcohol and ketone, or a solution in which these materials are diluted with water can be used. In order to spread the solvent over the adhesive in a short period of time, it is preferable that the solvent is supplied to a supporting plate in a state of being spun or vibrated, or after the solvent is supplied, the supporting plate is spun or vibrated. Additionally, it is preferable to adjust the temperature of the solvent to be in a range of 25–50° C.

BRIEF DESCRIPTION OF THE DRAWINGS

FIG. 6(*a*) is a view showing a state where a solvent supplying means is elevated and FIG. 6(*b*) is a view showing a state where a solvent supplying means is lowered.

DETAILED DESCRIPTION OF THE PREFERRED EMBODIMENTS

Figure 1:
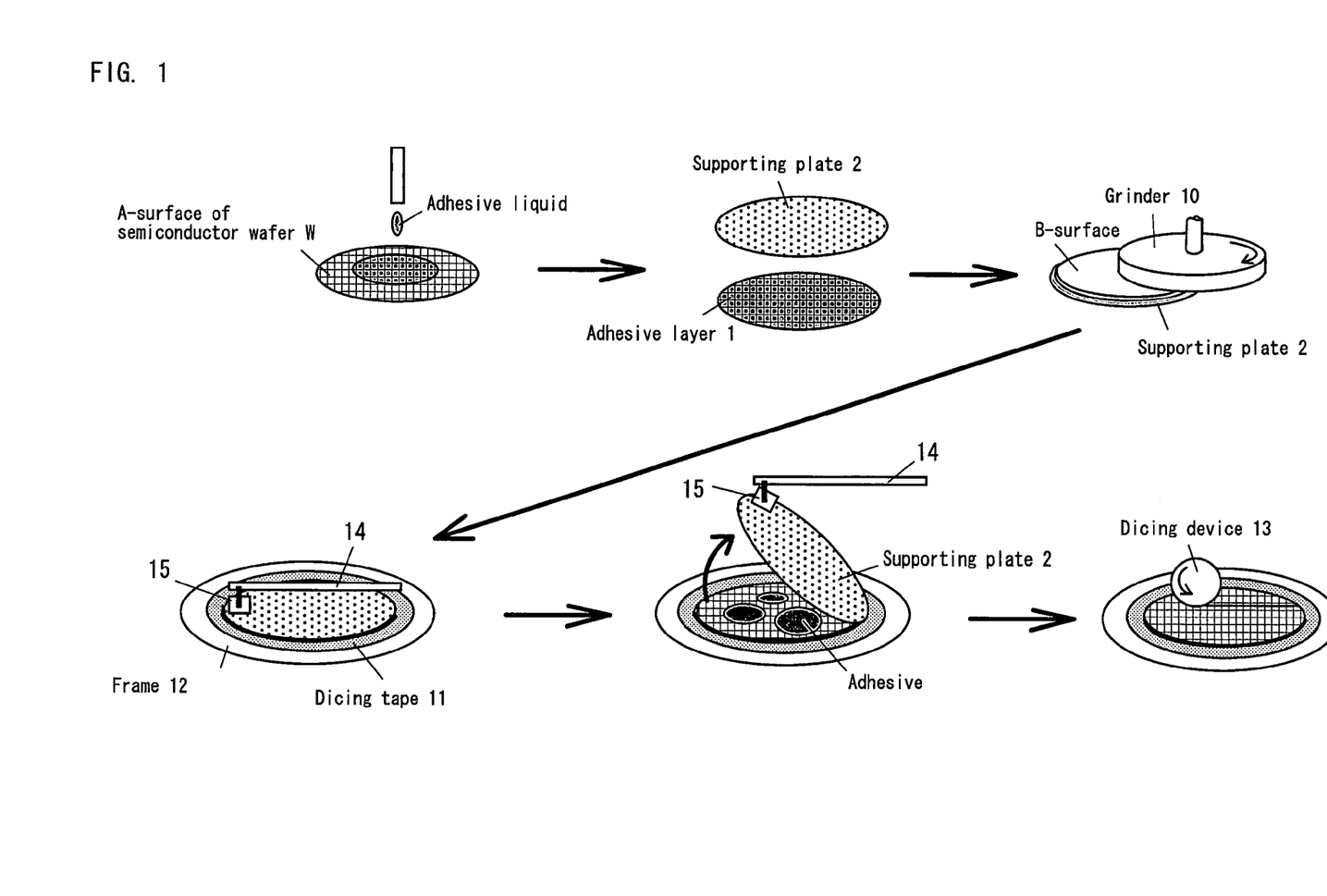
FIG. 1 is a view showing a supporting plate according to the present invention and processes for thinning a semiconductor wafer in which a stripping method for the supporting plate is incorporated.

Embodiments of the present invention will be described below with reference to the attached drawings. FIG. 1 is a view showing a supporting plate according to the present invention and processes for thinning a semiconductor wafer in which a stripping method for the supporting plate is incorporated. First, an adhesive liquid is applied onto a circuit(element)-formed surface of a semiconductor wafer W. The application is conducted by using a spinner or the like. The material for the adhesive liquid is a novolac-type phenol resin.

Next, the adhesive liquid undergoes preliminary drying, so that its flowability is reduced and it can keep its shape as an adhesive layer 1. For the preliminary drying, heating is conducted for 5 minutes at a temperature of 80° C. by using an oven. The thickness of the adhesive layer 1 is determined based on the irregularities of the circuit which has been formed on the surface of the semiconductor wafer W. If a sufficient thickness is not obtained by one application, application and preliminary drying are repeated a plurality of times. In this instance, the drying degree is adjusted to be higher with respect to preliminary drying for the adhesive layers other than the top layer, so that the flowability of the adhesive layers other than the top layer can be reduced.

Figure 2:
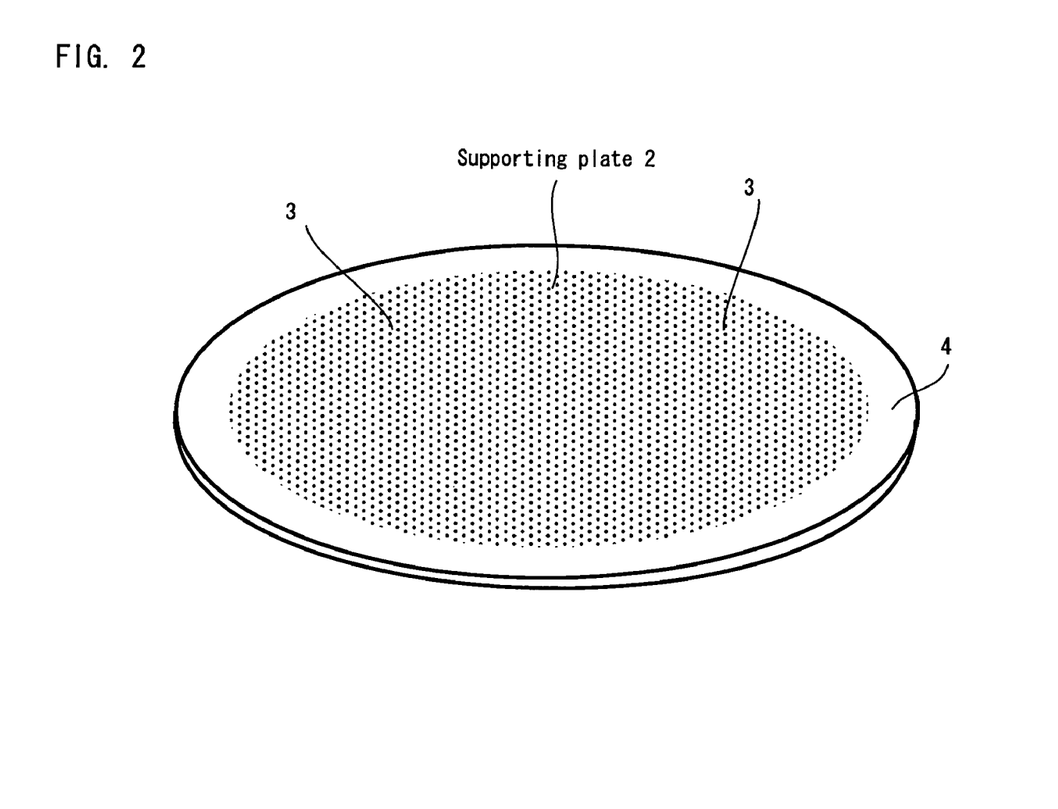
FIG. 2 is a perspective view of a supporting plate.
Figure 3:
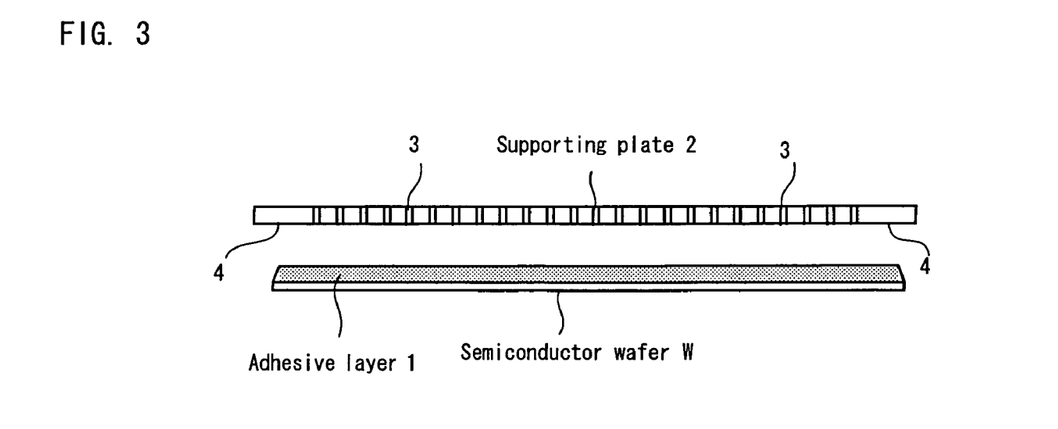
FIG. 3 is a view showing a state where a supporting plate is laid onto a semiconductor wafer.

Next, a supporting plate 2 is attached to the semiconductor wafer W on which the adhesive layer 1 of a desired thickness has been formed. As shown in FIGS. 2 and 3, the diameter of the supporting plate 2 is slightly larger than that of the semiconductor wafer W (by 2 mm in the radius). Also, the supporting plate 2 is made of an alloy of iron and nickel (alloy of 36% nickel: Invar) having a thickness of approximately 0.5 mm, and penetrating holes 3 having a diameter of approximately 0.5 mm are formed at a pitch of approximately 0.7 mm in the supporting plate 2. The outer peripheral portion of the supporting plate 2 is a flat portion 4 in which no penetrating hole is formed.

As shown in FIG. 3, the flat portion 4 is outside from the area covered by the edge portion of the semiconductor wafer W when the supporting plate 2 is laid onto the semiconductor wafer W. Since the semiconductor wafer W is thin, cracking or chipping easily occurs. If the edge portion of the semiconductor wafer W is within the area of the penetrating holes, this portion will have no support and easily crack or chip due to hydraulic pressure of a grinding liquid or pressure of a grinder. Therefore, in the embodiment, the edge portion of the semiconductor wafer W is located at the flat portion 4.

The supporting plate 2 can be made of a magnetic material. By doing so, it is possible to employ a magnet at the time of stripping and make the structure of the apparatus simple compared to the conventional case where alumina, aluminum nitride, boron nitride, or silicon carbide is used as a protecting base.

However, the supporting plate is not limited to the above-mentioned one. For example, the diameter of the supporting plate may be the same as that of the substrate. The one having no flat portion 4 is also possible, in which the penetrating holes are formed in the peripheral portion. In addition, ceramic or glass may be used as the material of the supporting plate. Incidentally, the diameter of the penetrating holes 3 is preferably 0.3–0.5 mm, and the pitch of the penetrating holes 3 is preferably 0.5–1.0 mm.

Figure 4:
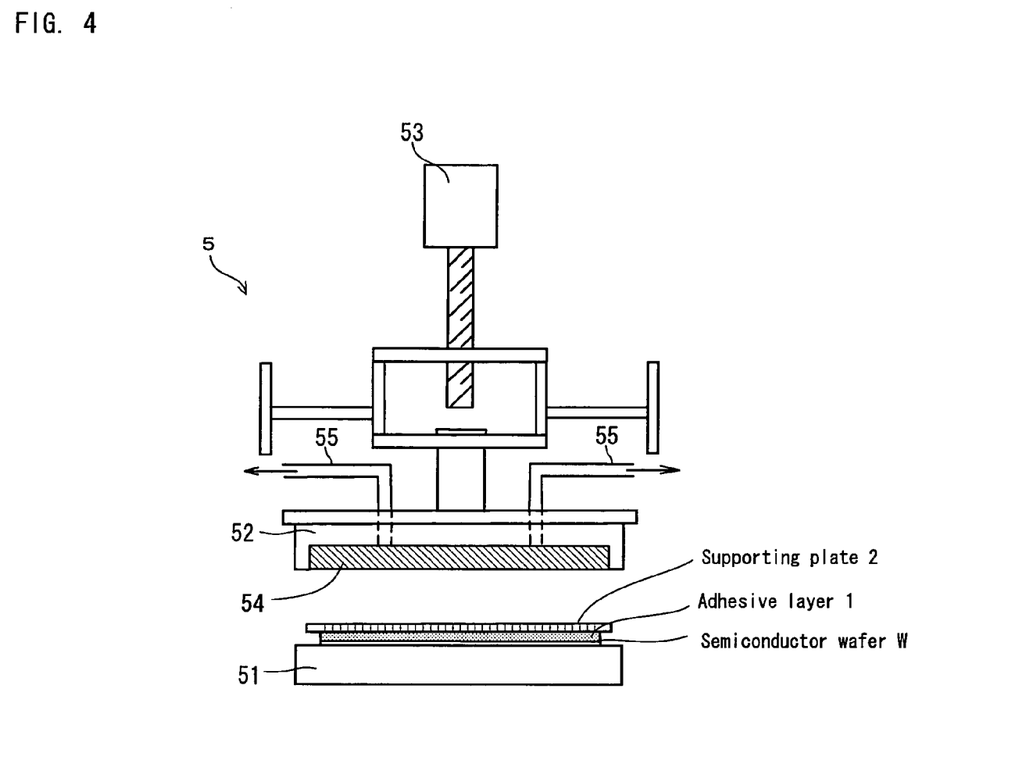
FIG. 4 is a schematic view of an attaching apparatus.

An attaching apparatus as shown in FIG. 4 is used for attaching the supporting plate 2 to the semiconductor wafer W. The attaching apparatus 5 comprises a bottom plate 51 and a top plate 52 which is positioned above the bottom plate 51. The top plate 52 is lifted and lowered by driving a motor 53. A sintered plate 54 of ceramic is fixed to the lower surface of the top plate 52, and an exhaust pipe 55 is connected to the sintered plate 54.

In operation, the semiconductor wafer W and the supporting plate 2 are set on the bottom plate 51 in a state where the semiconductor wafer W is positioned below and the supporting plate 2 is positioned above. The motor 53 is driven so as to lower the top plate 52, and the sintered plate 54 is pushed onto the supporting plate 2. At this time, heating (200° C. or less) may be performed simultaneously, so that the solvent of the adhesive layer 1 can be removed via the sintered plate 54 and the exhaust pipe 55.

Next, the semiconductor wafer W and the supporting plate 2 which have been united with respect to each other are taken from the attaching apparatus 5. The rear surface (B-surface) of the semiconductor wafer W is ground by a grinder 10, so that the semiconductor wafer W is thinned. Incidentally, water (grinding liquid) is supplied to the rear surface of the semiconductor wafer W in order to control friction heat generated between the grinder 10 and the semiconductor wafer W while grinding. Since a non-soluble material, which is not dissolved into water but dissolved into alcohol, is selected as the adhesive, it is possible to prevent the supporting plate 2 from stripping from the semiconductor wafer W at the time of grinding.

A circuit is formed on the rear surface (B-surface) of the semiconductor wafer W if needed, and thereafter the rear surface is fixed onto a dicing tape 11. The dicing tape 11 has an adhesive ability, and also is retained by a dicing frame 12.

Figure 5:
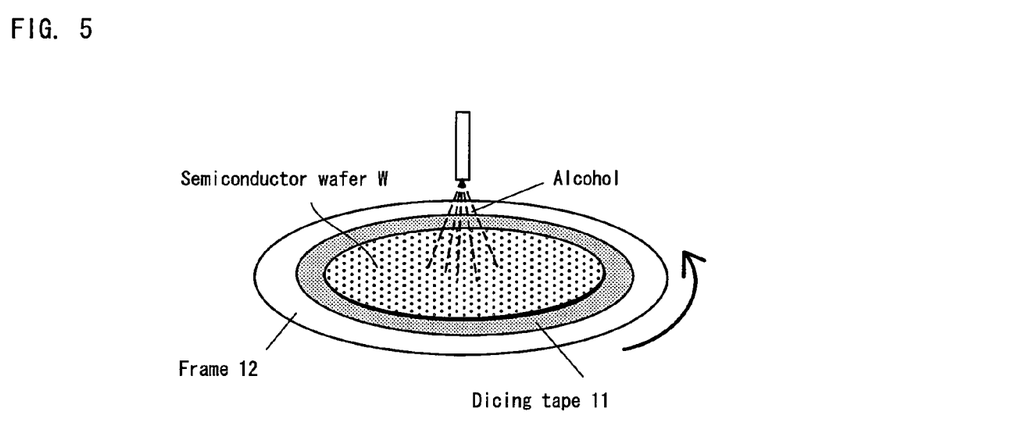
FIG. 5 is a view showing a state where alcohol is supplied from above a supporting plate.

Next, as shown in FIG. 5, alcohol is poured from above the supporting plate 2. The alcohol reaches the adhesive layer 1 through the penetrating holes 3 of the supporting plate 2, dissolves and removes the adhesive layer 1. In this instance, by spinning the frame 12 with a spinner which is not shown in the drawing, the alcohol can be spread over the whole surface of the adhesive layer 1 in a short period of time. While the spinning is being performed, it is preferable to apply pure water to the dicing tape so as to reduce the concentration of the solvent which comes into contact with the dicing tape. As for the alcohol, it is preferable to select the one whose molecular weight is small such as ethanol or methanol because alcohol having a smaller molecular weight can dissolve the adhesive more easily. Several kinds of alcohol may be mixed. Table 1 shows the comparisons of ethanol, methanol, a mixed solution of ethanol and water, and a mixed solution of methanol and water with respect to how much time it takes to complete the stripping. As seen from Table 1, when the ratio of alcohol and water is 1:1 or more, stripping can be completed in a short period of time. Instead of alcohol, it is possible to use ketone or a mixed solution of alcohol and ketone. Also, if the temperature of the solvent is adjusted to be in a range of 25–50° C., the time required for stripping can be reduced furthermore.

TABLE 1

|  | alcohol alone | alcohol 1:water 1 | alcohol 1:water 2 |
|---|---|---|---|
| ethanol | 3 minutes and 30 seconds | 6 minutes | 15 minutes |
| methanol | 3 minutes | 6 minutes | 17–19 minutes |

Figure 6:
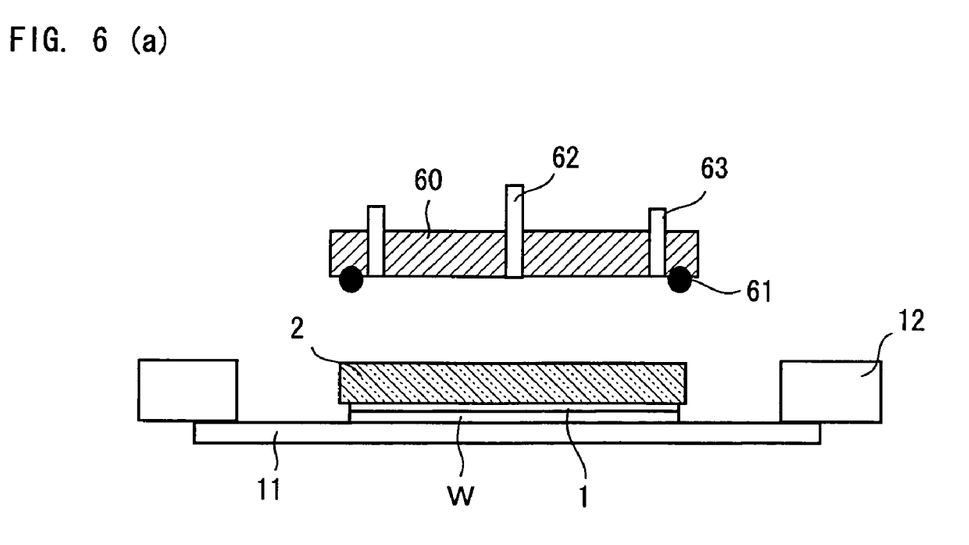

An embodiment of the solvent supplying means is shown in FIG. 6. In this embodiment, the solvent supplying means is comprised of a solvent supplying plate 60, and O-rings 61 which are provided in the lower surface of the solvent supplying plate 60. A solvent (stripping solution) supplying pipe 62 and a solvent discharging pipe 63 are connected to the solvent supplying plate 60. In operation, the solvent supplying means 60 in a state shown FIG. 6(*a*) is lowered, and thereby the solvent supplying means 60 is laid onto the upper surface of the supporting plate 2 via the O-rings 61 as shown in FIG. 6(*b*). Next, a solvent is supplied from the solvent supplying pipe 62 to the space surrounded by the supporting plate 2, the O-rings 61 and the solvent supplying plate 60. The solvent passes through the penetrating holes 3 formed in the supporting plate 2, dissolves and removes the adhesive layer 1.

Since the space to which a solvent is supplied is confined by the O-rings 61, it is possible to prevent the solvent from falling down to the dicing tape 11 and coming into contact with the dicing tape 11 as much as possible. In addition, it is possible to prevent the adhesive of the tape from coming into contact with the surface of the wafer.

As a means for supplying a solvent such as alcohol from the outside of the supporting plate 2 to the adhesive layer 1, the semiconductor wafer W to which the supporting plate 2 has been attached may be immersed in a tank filled with a solvent. In this case, ultrasonic vibration can make this process more effective.

After the adhesive layer 1 is dissolved in a manner mentioned above, the supporting plate 2 is removed. In the embodiment, the frame 12 is spun so as to remove the excessive solvent from the surface of the supporting plate 2. Next, a magnet 15 fixed to the tip end of an arm 14 is brought close to the supporting plate 2, and the magnet 15 is allowed to attract the supporting plate 2 by magnetic force. Next, the arm 14 is lifted obliquely, and the supporting plate 2 is stripped gradually from the periphery thereof.

After the supporting plate 2 is removed, the semiconductor wafer W is cut into a chip size by using a dicing device 13. After the cutting, the dicing tape 11 is irradiated with ultraviolet rays so as to reduce the adhesive ability of the dicing tape 11, so that the cut chip can be taken.

EFFECT OF THE INVENTION

According to the present invention, a plate having a number of penetrating holes is used as the supporting plate for a substrate such as a semiconductor wafer, and a solvent such as alcohol is supplied from outside the supporting plate. Consequently, the solvent is allowed to reach the adhesive through the penetrating holes of the supporting plate, and it is possible to strip the semiconductor wafer from the supporting plate in a short period of time. No cracking or chipping of the semiconductor wafer occurs while stripping.

As for the material of the supporting plate, the present invention uses a material whose thermal expansion coefficient ($1.5 \times 10^{-6}$ or less) is close to that of a silicon wafer ($4.0 \times 10^{-6}$ or less) such as an alloy of Ni and Fe, ceramic, and glass. Consequently, it is possible to prevent warpage from occurring due to the difference in the thermal expansion coefficient in a heat treatment. It is also possible to use a magnet for removing the supporting plate after the adhesive layer is dissolved by a solvent.

What is claimed is:

1. A method for stripping a supporting plate having a diameter identical to or larger than the diameter of a substrate to which the supporting plate is attached,
    wherein a plurality of penetrating holes are provided in the thickness direction of the supporting plate so as to allow a solvent to pass therethrough,
    wherein a diameter of the penetrating holes is 0.3–0.5 mm, and a pitch of the penetrating holes is 0.5–1.0 mm; and
    wherein the supporting plate comprises a low thermal expansion material having a thermal expansion coefficient of 1.5×10-6 or less
    from a substrate, comprising the steps of:
    supplying a solvent for dissolving an adhesive bonding the supporting plate and the substrate from outside the supporting plate;
    allowing the solvent to reach the adhesive through the penetrating holes of the supporting plate so as to dissolve the adhesive which has been cured; and
    stripping the supporting plate from the substrate by fixing the position of the substrate and lifting the support plate away from the substrate.

2. The method according to claim 1, wherein a solvent supplying plate is laid onto the supporting plate via O-rings, and a solvent is supplied through the solvent supplying plate to the space sealed by the supporting plate, the O-rings, and the solvent supplying plate.

3. The method according to claim 1, wherein a solvent is supplied by using a sprayer, an ultrasonic nozzle or a two-fluid nozzle, or by immersing in a tank filled with a solvent.

4. The method according to claim 1, wherein the solvent is selected from a group consisting essentially of alcohol, alkali, ketone, a mixed solution of alcohol and ketone, and a solution in which one or more of alcohol, alkali, and ketone are diluted with water.

5. The method according to claim 4, wherein the temperature of the solvent is adjusted to be in a range of 25–50° C.

6. The method according to claim 1, wherein the solvent is supplied to a supporting plate in a state of being spun or vibrated, or after the solvent is supplied, the supporting plate is spun or vibrated.

7. A method for stripping a supporting plate from a substrate, the supporting plate comprising a diameter identical to or larger than the diameter of the substrate to which the supporting plate is attached, wherein a plurality of penetrating holes are provided in the thickness direction of the supporting plate so as to allow a solvent to pass therethrough, the method comprising the steps of:

fixing the supporting plate to a frame to which a dicing tape has been attached;

supplying a solvent for dissolving an adhesive bonding the supporting plate and the substrate from outside the supporting plate;

allowing the solvent to reach the adhesive through the penetrating holes of the supporting plate so as to dissolve the adhesive which has been cured; and stripping the supporting plate from the substrate.

* * * * *

UNITED STATES PATENT AND TRADEMARK OFFICE
CERTIFICATE OF CORRECTION

PATENT NO. : 7,211,168 B2
APPLICATION NO. : 11/001574
DATED : May 1, 2007
INVENTOR(S) : Miyanari It is certified that error appears in the above-identified patent and that said Letters Patent is hereby corrected as shown below:

<u>Column 5</u>:
    Line 33, change "can be reduced furthermore." to --can be reduced further.--.
<u>Column 6</u>:
    Line 46, change "to pass therethrough," to --to pass therethrough;--.
    Line 52, change "of 1.5×10-6 or less" to --of $1.5\times10^{-6}$ or less from a substrate, comprising the steps of:--.
    Delete Line 53.

Signed and Sealed this

Seventh Day of August, 2007

JON W. DUDAS
*Director of the United States Patent and Trademark Office*